(12) United States Patent
Jacobson (10) Patent No.: US 7,285,876 B1
(45) Date of Patent: Oct. 23, 2007

(54) REGENERATIVE GATE DRIVE CIRCUIT FOR POWER MOSFET

(75) Inventor: Boris S. Jacobson, Westford, MA (US)

(73) Assignee: Raytheon Company, Waltham, MA (US)

(*) Notice: Subject to any disclaimer, the term of this patent is extended or adjusted under 35 U.S.C. 154(b) by 44 days.

(21) Appl. No.: 11/415,756

(22) Filed: May 1, 2006

(51) Int. Cl.
   *H02B 1/24* (2006.01)
(52) U.S. Cl. ..................... 307/127
(58) Field of Classification Search ........... 307/87, 307/127, 116, 125
   See application file for complete search history.

(56) References Cited

U.S. PATENT DOCUMENTS

| | | |
|---|---|---|
| 5,264,736 A | 11/1993 | Jacobson |
| 5,734,205 A * | 3/1998 | Okamura et al. ........... 307/110 |
| 6,208,535 B1 | 3/2001 | Parks |
| 6,477,065 B2 | 11/2002 | Parks |
| 6,556,062 B1 | 4/2003 | Wallace |
| 6,992,520 B1 | 1/2006 | Herbert |

OTHER PUBLICATIONS

Y. Chen, et al., "A resonant MOSFET gate-driver with complete energy recovery," Proceedings of the 3rd IEEE IPEMC 2000, vol. 1, pp. 402-406.
P. Dwane, et al., "An assessment of resonant gate drive techniques for use in modern low power DC-DC converters," IEEE APEC 2005, vol. 3, pp. 1572-1580.
D. Maksimovic, "A MOS gate drive with resonant transitions," Record of the 22nd IEEE PESC, 1991, pp. 527-532.
W.A. Tobisz, et al., "Zero-Voltage-switched quasi-resonant buck and flyback converters—experimental results at 10 MHz", IEEE PESC '87 Conference, 1987, pp. 404-413.
I.D. de Vries, "A resonant power MOSFET IGBT gate driver," APEC 2002, vol. 1, pp. 179-185.

* cited by examiner

*Primary Examiner*—Shawn Riley
(74) *Attorney, Agent, or Firm*—John H. Pearson, Jr., Esq.; Walter F. Dawson, Esp.; Pearson & Pearson, LLP (57) ABSTRACT

A regenerative drive circuit for driving the gate of a power MOSFET of a switched mode power converter includes a pair of MOSFETS connected in series with a pair of coupled inductors L1, L2 and L3, L4 which are connected in parallel. A first blocking capacitor is connected in series with inductor L3 and a second blocking capacitor is connected in series with inductor L4. A positive voltage source is provided to one MOSFET and a negative voltage source is provided to the other MOSFET, and the gate drive circuit provides energy recover.

14 Claims, 5 Drawing Sheets

REGENERATIVE GATE DRIVE CIRCUIT FOR POWER MOSFET

BACKGROUND OF THE INVENTION

1. Field of the Invention

This invention relates generally to switched mode power converters and in particular to a regenerative gate drive circuit for voltage control of MOSFETs (Metal Oxide Silicon Field Effect Switching device) and IGBT (Insulated Gate Bipolar Switching device) having means for recovering energy stored in the gate capacitance and means for speeding up gate voltage transitions and reducing output impedance.

2. Description of the Related Art

Losses in the gate drive circuits of switched mode power converters operating in the hundreds of kilohertz and megahertz regions significantly affect their efficiency and complicate thermal design.

Figure 1:
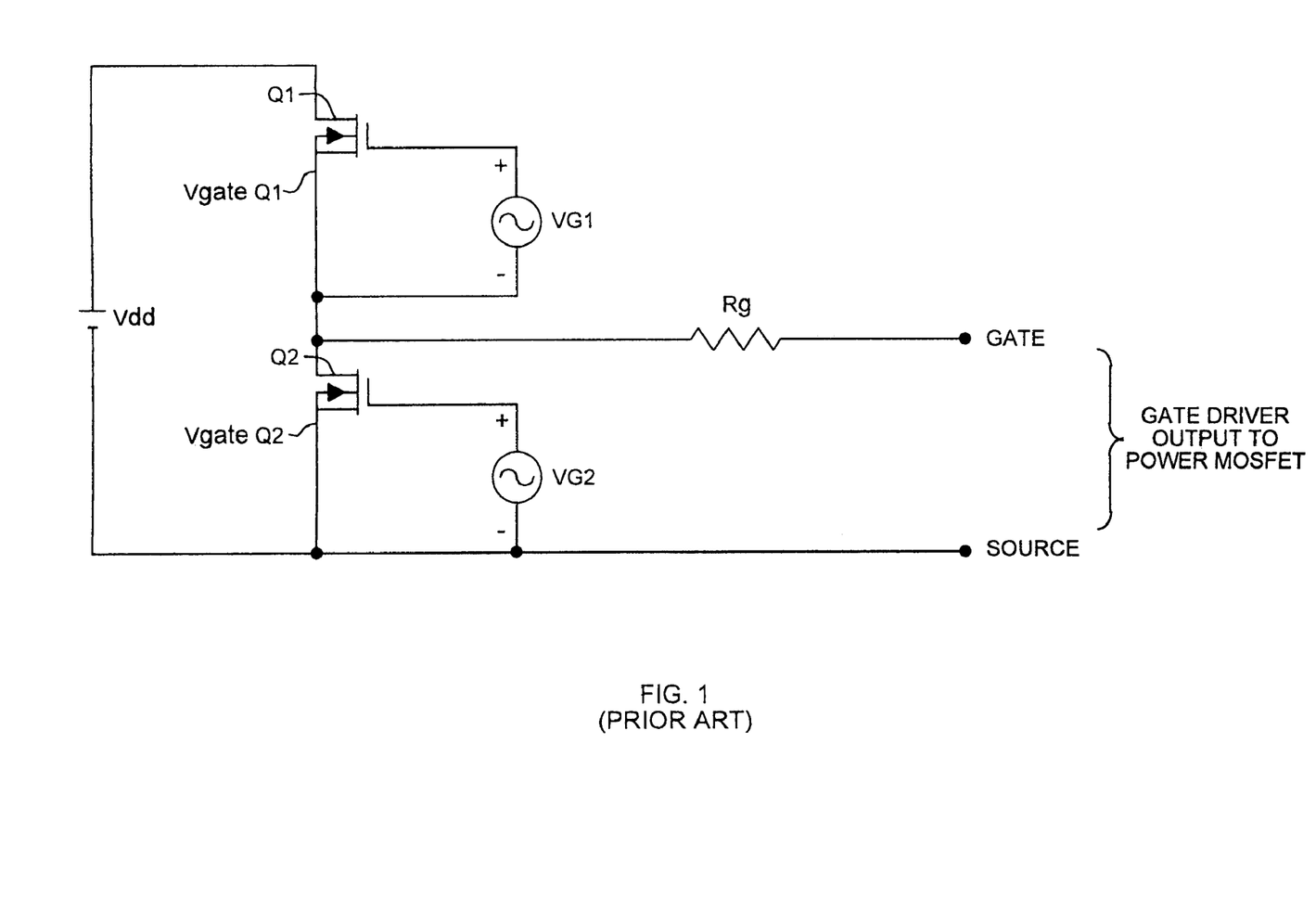
FIG. 1 is a schematic diagram of a prior art gate drive circuit having a single bias power supply.

As conventional prior art gate drive circuit is shown in FIG. 1 comprising a totem pole pair of field effect switching devices Q1 and Q2 and a gate resistor, $R_g$. This topology suffers from excessive power dissipation particularly at high frequency. The three major sources of power dissipation are as follows: 1. capacitive energy losses, 2. cross conduction power losses, and 3. linear operation losses.

1. Capacitive energy losses occur during turn-on and turn-off. During turn-on, the gate energy ($\frac{1}{2}C_{gs}V_{dd}^2$) is stored within the equivalent gate capacitance and the same amount of energy is dissipated in the total series resistance (gate driver resistance $R_g$ and internal gate resistance of the switch Q2). During turn-off, the same energy stored in the gate ($\frac{1}{2}C_{gs}V_{dd}^2$) is dissipated in the total series resistance. Therefore, the total dissipated power is:

$$P_{capacitive} = fC_{gs}V_{dd}^2$$

where $f$ is switching frequency $C_{gs}$ is gate-to-source capacitance $V_{dd}$ is supply voltage The power is dissipated within the gate circuitry $R_g$ and the internal MOSFET gate resistance. While the energy is independent of the charge and discharge path resistance, this resistance determines the switching times and the current rating of the gate-drive switches.

2. Cross conduction power losses occur when in order to generate narrow pulses, one of the totem pole resistors is turned on before the other one is turned completely off. This mode of operation results in cross conduction losses because both gate drive switching devices conduct simultaneously during switching transitions.

3. Linear operation losses are caused by an overlap of voltage and current across gate drive switching devices during switching transitions.

Another problem of the conventional circuit of FIG. 1 is that the parasitic inductance in series with the gate limits the rate of change in the gate current, and thereby increases the switching time. During switching transients, current flowing through the 'off' switch Miller capacitance will go through the gate capacitance as well, turning the device back on, unless an alternative low impedance path is available. In the resistive circuit, this impedance from $Z_g$ with the switch Q2 in the on state, where $Z_g$ is the total signal and return path impedance from the power supply to the MOSFET's gate.

In a paper by W. A. Tobisz et al, entitled "Zero-Voltage-switched quasi-resonant buck and flyback converters—experimental results at 10 MHz", Proceedings of IEEE PESC '87 Conference, 1987, pp 404-413, a quasi-resonant gate-drive offers reduced losses at turn-on of the power MOSFET. This circuit does not clamp the gate voltage and may cause an over-voltage, and the gate energy is dissipated within the switch at turn-off.

Circuits described in T. Chen, et al., "A resonant MOSFET gate-driver with complete energy recovery" Proceedings of the 3rd IEEE Power Electronics and Motion Control Conference (IPEMC) 2000, Vol. 1, p. 402-406, and I. D. de Vries, "A resonant power MOSFET/IGBT gate driver", Applied Power Electronics Conference and Exposition, APEC 2002, vol. 1, pp. 179-185, recover gate energy by reversing the voltage across the resonant inductor once the energy has been transferred to it from the gate capacitance. Topology in Y. Chen, et al. clamps the gate voltage to the source through additional pair of semiconductor devices, but does not provide protection against cross conduction and has low output impedance only during conduction of the clamp diodes. While the gate drive circuit in I. D. de Vries et al, prevents cross conduction, it has high output impedance that makes the MOSFET gate susceptible to false triggering.

In a paper by D. Maksimovic entitled "A MOS gate drive with resonant transitions", Record of the 22nd IEEE Annual Power Electronics Specialists Conference (PESC), 1991, pp. 527-532, it describes a MOS gate drive circuit that clamps gate voltage to the source and prevents cross conduction during normal operation (excluding operation in the presence of Electromagnetic Pulse of EMP). However, it requires placement of gate drive switching devices close to the MOSFET gate to minimize wiring inductance.

U.S. Pat. No. 5,264,736 issued Nov. 23, 1993 to B. Jacobson discloses a high frequency resonant gate drive for a Power MOSFET. This regenerative topology enables partial energy recovery and protects against cross-conduction. It also provides low output impedance because currents circulate in clamp diodes during the time interval between the gate voltage transitions. However, energy recovery takes place only during the narrow time interval prior to the turn off of the main switching device when voltage across the resonant inductor exceeds the bias supply.

U.S. Pat. No. 6,208,535 issued Mar. 27, 2001 to David Parks discloses a resonant gate driver that provides a resonant switching for a field effect transistor (FET) and associated circuits such as power supplies with synchronous output rectifiers. The resonant switching for a junction FET invokes bipolar mode operation with a diode clamping of the gate, which results in bipolar mode operation without a separate bias power supply. However, this resonant gate driver does not provide energy recovery for efficiency improvement.

In a paper by Patrick Dwane, et al. entitled "An Assessment of Resonant Gate Drive Techniques for use in modern Low Power DC-DC converters" IEEE, Jan. 2005, pp. 1572-1580, various gate drive topologies are reviewed and described including several of the above-identified prior art references.

SUMMARY OF THE INVENTION

Accordingly, it is therefore an object of this invention to provide a regenerative gate drive circuit that improves noise immunity, speeds up switching transition times, and reduces power consumption.

It is another object of this invention to provide a tuned network to speed-up voltage transitions and reduce output impedance.

It is a further object of this invention to reduce losses in the gate drive circuits of a switched-mode power converter.

These and other objects are further accomplished by providing a regenerative gate drive circuit comprising a positive power source coupled to a first switching device, a negative power source coupled to a second switching device, a first inductor network comprises a first winding and a second winding on each side of a center tap, said center tap being coupled to a gate input of a power MOSFET, a second inductor network comprises a first winding in series with a first blocking capacitor and a second winding in series with a second blocking capacitor on each side of a center tap, the center tap being coupled to the gate input of a power MOSFET and to the center tap of the first inductor network, the first switching device, coupled between the positive power source and the first winding of the first inductor network in parallel with the first blocking capacitor in series with the first winding of the second inductor network, provides a path for a first current to flow through the first switching device and the first winding of the first inductor network in parallel with the first winding of the second inductor which is in series with the first blocking capacitor, the second switching device, coupled between the negative power source and the second winding of the first inductor network in parallel with the second winding of the second inductor network, the second winding being in series with a second blocking capacitor, provides a path for resonant discharging of the power MOSFET, a first input signal is coupled to a gate of the first switching device for controlling the first switching device, a second input signal is coupled to a gate of the second switching device for controlling the second switching device, means coupled to the first switching device and the second switching device for limiting the voltage provided at the gate of the power MOSFET and for conducting inductive current, and means coupled between the positive power source and the second switching device and between the negative power source and the first switching device for limiting the voltage at the gate of the power MOSFET and for conducting inductive current.

Each of the first switching device and the second switching device comprises a MOSFET. The first input signal is coupled to an input gate of the first MOSFET, and second input signal is coupled to an input gate of the second MOSFET. The first winding and the second winding of the first inductor network and the second inductor network comprises an equal number of turns. The limiting means comprises a first diode coupled between the positive power source and the second switching device and a second diode coupled between the negative power source and the first switching device. The second inductor network provides reduced output impedance thereby improving noise immunity. The first inductor network and the second inductor network provide a high impedance between the first switching device and the second switching device when the switching devices are both conducting simultaneously. The circuit comprises a dead time interval when the first input signal and the second input signal are at a level that turns-off the first switching device and the second switching device thereby enabling energy recovery. Control of the dead time interval is provided by means for sensing any one of an output voltage or output current of the power MOSFET, or power across the power MOSFET or temperature at a junction of the power MOSFET. These objects are further accomplished by a method for providing a regenerative gate drive circuit comprising the steps of providing a positive power source coupled to a first switching device, providing a negative power source coupled to a second switching device, providing a first inductor network having a first winding and a second winding on each side of a center tap, said center tap being coupled to a gate input of a power MOSFET, providing a second inductor network having a first winding in series with a first blocking capacitor and a second winding in series with a second blocking capacitor on each side of a center tap, the center tap being coupled to the gate input of a power MOSFET and to the center of tap of the first inductor network, providing a path for a first current to flow through the first switching device and the first winding of the first inductor network in parallel with the first winding of the second inductor which is in series with the first blocking capacitor, the first switching device being coupled between the positive power source and the first winding of the first inductor network in parallel with the first blocking capacitor in series with the first winding of the second inductor network, providing a path for resonant discharging of the power MOSFET through the second switching device coupled between the negative power source and the second winding of the first inductor network in parallel with the second winding of the second inductor network, the second winding being in series with a second blocking capacitor, controlling the first switching device by a first input signal coupled to a gate of the first switching device, controlling the second switching device by a second input signal coupled to a gate of the second switching device, limiting the voltage provided at the gate of the power MOSFET and conducting inductive current by means coupled to first switching device and the second switching device, limiting the voltage provided at the gate of the power MOSFET and conducting inductive current by means coupled between the positive power source and the second switching device and between the negative power source and first switching device.

The method includes the step of providing a MOSFET for each of the first switching device and the second switching device. The method comprises the steps of coupling the first input signal to an input gate of the first MOSFET, and coupling the second input signal to an input gate of the second MOSFET. The method further comprises the step of providing the first winding and the second winding of the first inductor network and the second inductor network with an equal number of turns. The step of limiting the voltage of the gate of the power MOSFET comprises the steps of providing a first diode coupled between the positive power source and the second switching device, and providing a second diode coupled between the negative power source and the first switching device.

Additional objects, features and advantages of the invention will become apparent to those skilled in the art upon consideration of the following detailed description of the preferred embodiments exemplifying the best mode of carrying out the invention as presently perceived.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENT

Figure 2:
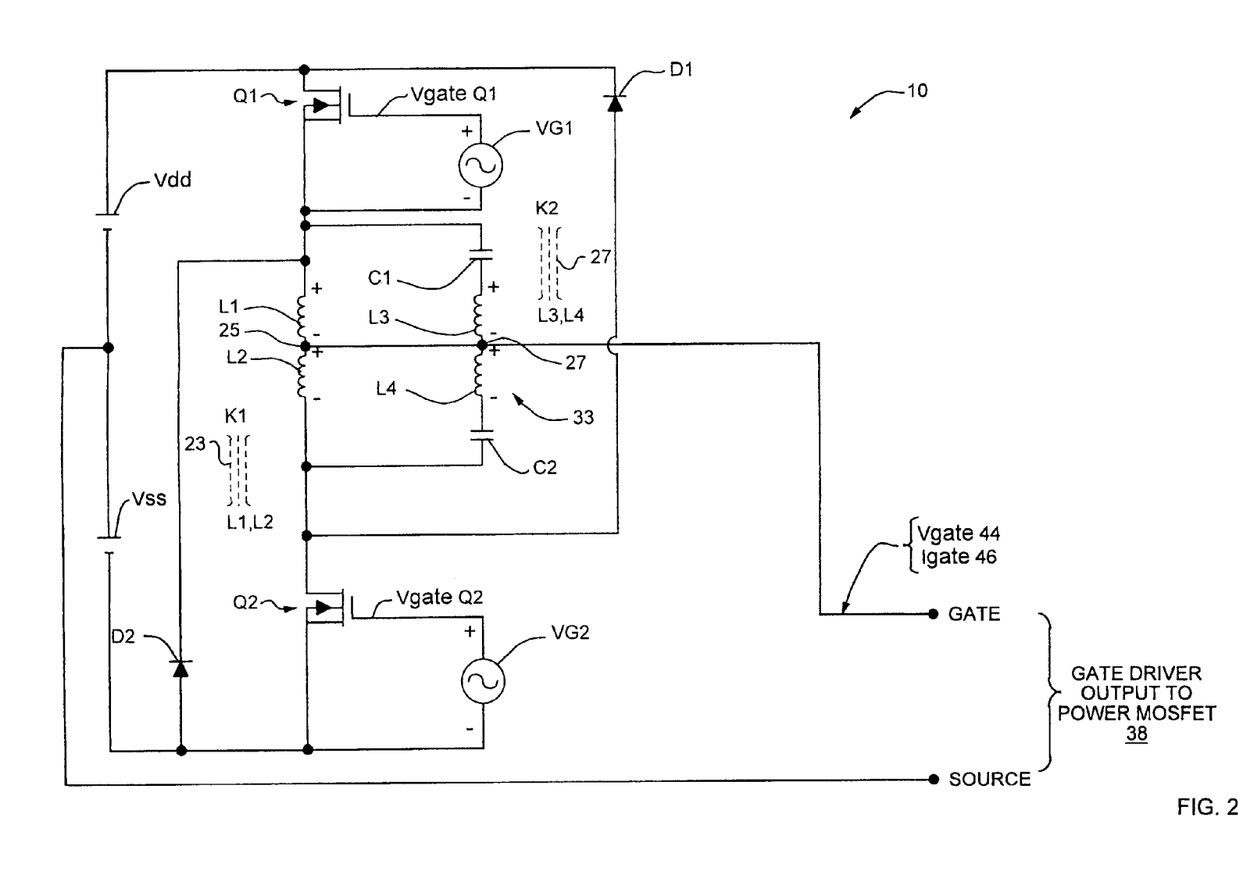
FIG. 2 is a schematic diagram of a regenerative gate drive circuit according to the present invention.

Referring to FIG. 2, a circuit diagram of a regenerative gate drive circuit 10 is shown embodying the principles of the invention. The regenerative gate drive circuit 10 comprises a pair of MOSFET (metal oxide silicon field effect switching) devices Q1, Q2 connected in a series with coupled inductors L1, L2 between them, the coupled inductors having a center tap 25 which is connected to a gate of a power MOSFET 38. The coupled inductors L1, L2 comprise an upper half winding and a lower half winding each having an inductance of 300 mH with an inductor coupling factor (k) of 0.92.

Also, connected in parallel with the main coupled inductors L1, L2 are coupled inductors L3, L4 with an inductor coupling factor (k) of 0.92 and blocking capacitors C1, C2. Blocking capacitor C1 is connected in series with inductor L3 and another blocking capacitor C2 is connected in series with inductor L4. The center tap 27 of coupled inductor. L3, L4 connects to the center tap 25 of L1 and L2.

A power or voltage source $V_{dd}$ has a positive terminal connected to a drain terminal of MOSFET Q1 and has a negative terminal connected to a positive terminal of voltage source $V_{ss}$. The negative terminal of $V_{ss}$ connects to the source of MOSFET Q2. Two clamping diodes D1, D2 are provided wherein diode D1 is connected from the voltage source $V_{dd}$ to the drain of MOSFET Q2, and diode D2 is connected from the voltage source $V_{ss}$ to the source of MOSFET Q1. The diodes D1, D2 clamp the voltages at the gate of the power MOSFET 38 to $V_{dd}$ and $V_{ss}$ respectively which limits the voltage across the drive MOSFET switching devices Q1, Q2 to the sum of the two voltage sources $V_{dd}$ and $V_{ss}$. In FIG. 2 $V_{dd}$ provides 12.6 volts DC and $V_{ss}$ provides 5 volts DC.

Figure 3:
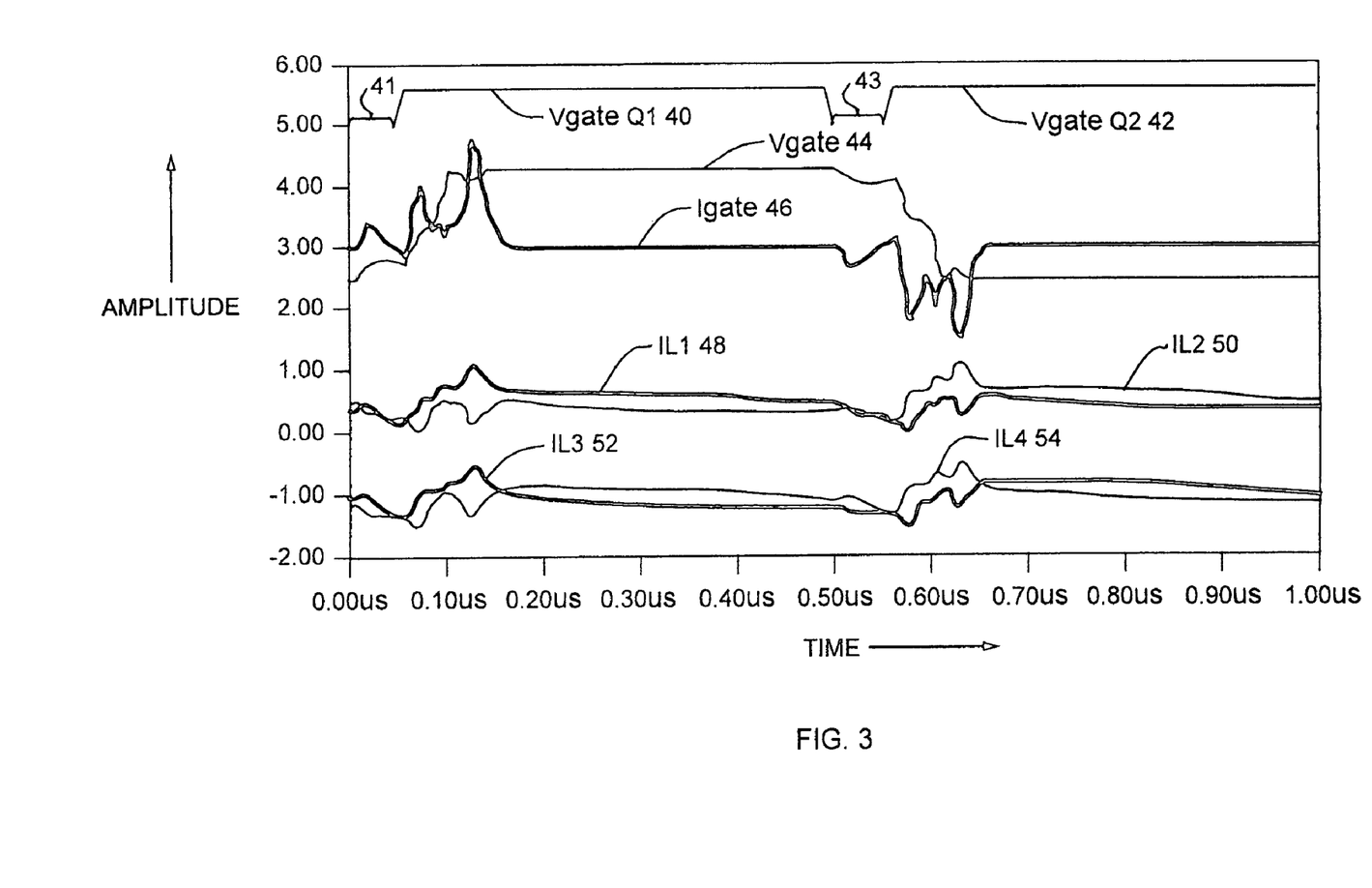
FIG. 3 is a graph of typical voltage and current waveforms at the gate of MOSFETS Q1 and Q2 and typical waveforms of the current through inductors L1, L2, L3 and L4 of FIG. 2.
Figure 4:
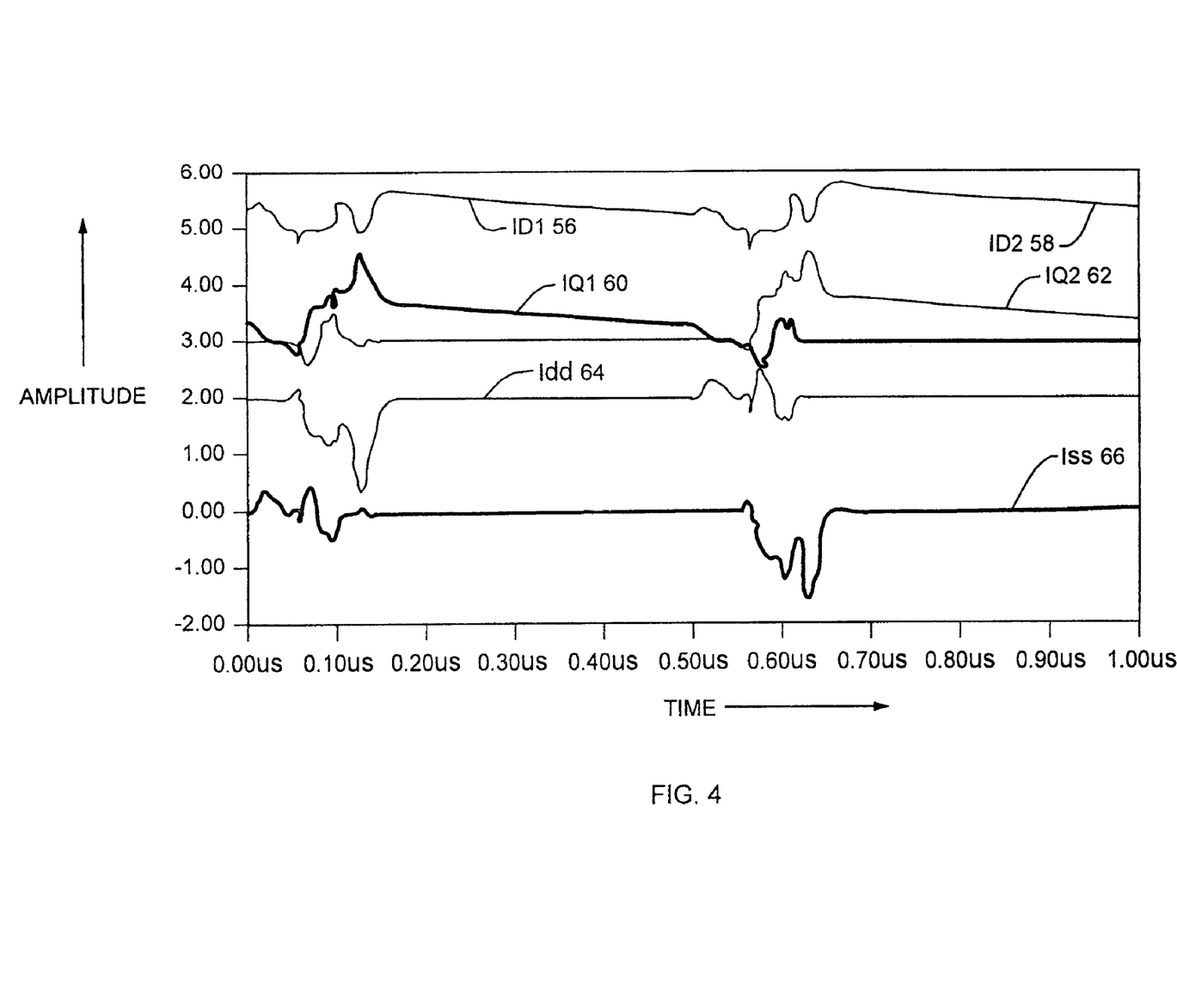
FIG. 4 is a graph of typical current waveforms through the voltage sources $V_{dd}$ and $V_{ss}$, diodes D1 and D2 and switching devices Q1 and Q2.

Referring to FIG. 2, FIG. 3 and FIG. 4, the operation of FIG. 2 is described by referring to the waveforms shown in FIG. 3 and FIG. 4. FIG. 3 is a graph of typical voltage and current waveforms at the gates of MOSFETS Q1 and Q2 and typical waveforms of the current through coupled inductors L1 and L2 and coupled inductors L3 and L4. FIG. 4 is a graph showing typical current waveforms through the voltage sources $V_{ss}$ and $V_{ss}$, diodes D1 and D2, and MOSFET switching devices Q1 and Q2.

At the beginning of the switching cycle at time t=0, the gate signal $V_{gate}Q2$ provided by signal VG2 for the switching device Q2 is switched off (low) and it starts turning-off. Switching device Q1 is not turned-on yet, so the switching cycle begins with a dead time interval 41 when gate signals $V_{gate}$ Q1 and $V_{gate}$ Q2 to both switching devices are off. At t=0, output of the gate driver 10 (gate voltage of the power MOSFET 38) is negatively biased, diode D1 is off, and diode D2 conducts current through inductors L1, L2, and Q2. As Q2 turns off, its voltage begins to rise and current in the inductor L2 diverts to the inductor L4. At the same time, current in the inductor L1 starts flowing through the power MOSFET 38 gate, the bias voltage source $V_{ss}$ (thereby regenerating energy), and the diode D2. Thus, at the end of the dead time interval 41 (t=50 ns), the power MOSFET 38 gate capacitance is partially discharged, switching devices Q1 and Q2 are off, currents in both diodes D1 and D2 are close to zero, and both coupled inductors L1, L2 and L3, L4 conduct current.

The dead time interval 41 ends at t≈50 ns when the gate signal $V_{gate}$ Q1 from VG1 starts turning on switching device Q1. As Q1 turns on, the voltage is applied to the coupled inductors L1, L2 and L3, L4 and the power MOSFET 38 gate is resonantly charged by the sum of two currents. The source $V_{dd}$ generates the first current that flows through Q1 and L1 in parallel with L3. The second current is the one that was stored in L2 and L4 and it flows through the integral body diode of the switching device Q2 returning energy to the source $V_{ss}$. At the end of the positive half wave of the resonant current $I_{gate}$ 46, the current in the integral body diode of the switching device Q2 changes direction and starts flowing through its channel while voltage builds up across this switching device Q2. While Q2 conducts current, the voltage source $V_{ss}$ forces current increase in inductors L2 and L4. At the end of the charge-up time interval (t=100 ns), the power MOSFET gate capacitance is almost fully charged, Q1 is on, Q2 is off, and inductor currents continue increasing.

Because the resonant gate drive circuit 10 has such non-linear elements as the power MOSFET 38 gate and reverse transfer capacitance, it is exceedingly difficult to obtain a closed form solution for its voltages and currents. However, the following equations derived from a simplified LCR equivalent circuit with square wave excitation provide an assessment of the peak gate drive current $I_{pk}$ and its resonant frequency (f) during this time interval.

$$I_{peak}=(V_{dd}-0.5(V_{dd}+V_{ss})-V_{Gate(0)})/2\pi f(L-M) \quad (1)$$

$$f=\sqrt{(1/(L-M)C_{eq}-R/2(L-M))} \quad (2)$$

where, $V_{dd}$ is positive source voltage $V_{ss}$ is negative source voltage $V_{Gate(0)}$ is voltage across the power MOSFET 38 gate at the beginning of the switching period M is mutual inductance, M=kL k is inductor coupling factor $C_{eq}$ is equivalent gate capacitance of the power MOSFET Still referring to FIG. 3 and FIG. 4, the next time interval begins when the power MOSFET 38 starts turning-on at t≈100 ns. At this time, drain voltage of the switching device Q2 changes and becomes negative while current through Q2 approaches zero. Since currents in the inductors L2 and L4 pass through Q2 and can not disappear, the summary current $I_{L2}+I_{L4}$ begins flowing through the diode D1 thereby returning energy stored in the inductors L2 and L4 to the power source $V_{dd}$. As the power MOSFET 38 turns-on, the gate drive current 10 begins recharging its reverse transfer ("Miller") capacitance. A major part of this current comes from the source $V_{dd}$ through the inductors L1 and L3. The recharging of the Miller capacitance also causes a dip in the power MOSFET 38 gate voltage waveform $V_{gate}$ 44.

Still referring to FIG. 3 and FIG. 4, the turn-off processes are similar to the ones that take place during the turn-on interval. At the beginning of the turn-off interval at t≈500 ns, the gate signal $V_{gate}$ Q1 from VG1 for the switching device Q1 is switched-off, and it starts turning-off. The switching device Q2 is not turned-on yet, so the turn-off interval begins with another "dead time" interval 43 when gate signals to both switching devices Q1 and Q2 are off. At t≈500 ns, the output of the gate drive circuit 10 (to the power MOSFET 38 gate) is positive, D2 is off, and D1 conducts current through inductors L1, L2, and Q1. As Q1 turns-off, its drain voltage begins to rise and current in the inductor L1 diverts to the inductor L3. At the same time, current in the inductor L2 starts flowing through the power MOSFET 38 gate, the bias power source $V_{dd}$ (thereby regenerating energy), and the diode D1. Thus, at the end of the dead time interval at t≈550 ns, the power MOSFET 38 gate capacitance is partially discharged, switching devices Q1 and Q2 are off, currents in both diodes D1 and D2 are close to zero, and both coupled inductors L1, L2 and L3, L4 conduct current.

The dead time interval 43 ends at t≈550 ns when the gate signal $V_{gate}$ Q2 from VG2 starts turning-on the switching device Q2. As Q2 turns-on, the voltage is applied to the coupled inductors L1, L2 and L3, L4 and the power MOSFET 38 gate is resonantly discharged by the sum of two currents. The source voltage $V_{ss}$ generates the first current that flows through Q2 and L2 in parallel with L4. The second current is the one that is stored in inductors L1 and L3, and it flows through the integral body diode of the switching device Q1 returning energy to the source $V_{dd}$. At the end of the positive half wave of the resonant current $I_{gate}$ 46 the current in the integral body diode of the switching device Q1 changes direction and starts flowing through the switching device's channel while it turns off. While Q1 conducts current, the source $V_{dd}$ builds up current in inductors L1 and L3. At the end of the power MOSFET 38 gate discharge time interval (t≈600 ns), the gate capacitance is almost fully discharged, Q2 is on, Q1 is off, and inductor currents continue increasing. Similarly to the turn-on, expressions (1) and (2) determine approximate values of the discharge current and its resonant frequency.

The next time interval begins when the power MOSFET 38 starts turning off at t≈600 ns. At this time, drain voltage of the switching device Q1 turns negative and its current declines. Since currents in the inductors L1 and L3 flowing through Q1 can not disappear, the summary current $I_{L1}+I_{L3}$ flows through the diode D2 thereby returning energy stored in the inductors L1 and L3 to the power source $V_{ss}$. As the power MOSFET 38 turns off, the gate drive current begins recharging its reverse transfer ("Miller") capacitance. A major part of this current comes from the voltage source $V_{ss}$ through the inductors L2 and L4. The recharging of the Miller capacitance also causes a dip in MOSFET gate voltage waveform $V_{gate}$ 44.

Referring to FIG. 2, the energy regenerative gate drive circuit 10 has positive and negative voltage sources $V_{dd}$, $V_{ss}$. The negative source $V_{ss}$ improves noise immunity of the gate drive circuit 10 by developing negative voltage across the power MOSFET 38 gate during the off time. Both voltage sources take part in energy recovery wherein during turn-on of the MOSFET, energy is returned to the negative voltage source $V_{ss}$, and during turn-off it is returned to the positive voltage source $V_{dd}$. Therefore, the efficiency of the regenerative gate drive circuit 10 is improved.

During the dead time intervals 41, 43, gate capacitance of the power MOSFET 38 is partially discharged prior to on-to-off and off-to-on transitions thereby speeding up both switching transitions compared to the circuit disclosed in U.S. Pat. No. 5,264,736. The partial discharge represents MOSFET gate energy recovery through clamp diodes D1 and D2 and resonant inductors L1, L2 and L3, L4.

Figure 5:
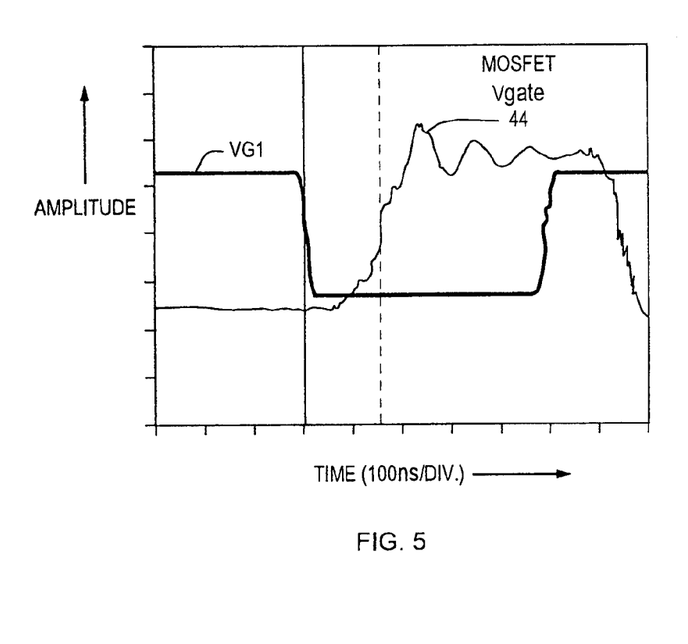
FIG. 5 is a graph of measured power MOSFET gate voltage generated by the gate drive circuit described in U.S. Pat. No. 5,264,736.
Figure 6:
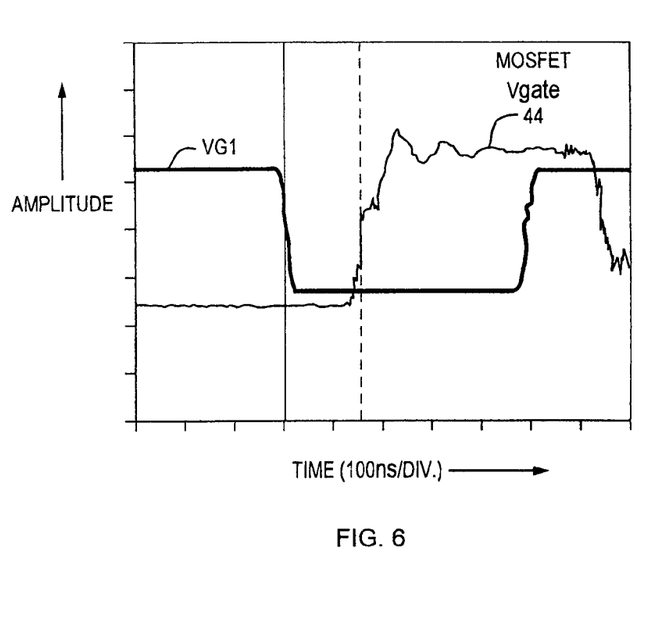
FIG. 6 is a graph of a measured power MOSFET gate voltage generated by the regenerative gate drive circuit of FIG. 2.

Referring to FIG. 5 and FIG. 6, FIG. 5 is a graph showing a measured power MOSFET 38 gate voltage relative to input gate signal VG1 generated by prior art gate drive circuit of FIG. 1, and FIG. 6 is a graph showing a measured power MOSFET 38 gate voltage relative to the input gate signal VG1, generated by the regenerative gate drive circuit 10 of FIG. 2. The LLCC network 33 comprised of coupled inductors L3, L4 and capacitors C1, C2 speed-up charging and discharging power MOSFET 38 that is critically important to reducing switching losses. Compared with the gate drive circuit of FIG. 2, the conventional gate driver disclosed in U.S. Pat. No. 5,264,736 has slower transitions. The LLCC network 33 also reduces the output impedance of the gate driver circuit 10 thereby improving its noise immunity, and it reduces the linear operation losses of the gate driver circuit 10 because gate drive switching devices Q1 and Q2 are decoupled from the power MOSFET 38 gate capacitance.

The prior art conventional gate driver of FIG. 1 has 33% higher power consumption than that of the gate driver circuit 10 of FIG. 2. This was determined by averaging measurements of four prototypes of the gate driver circuit 10 at 750 kHz switching frequency.

Referring again to FIG. 2 the circuit components used to implement the preferred embodiment at the 1 MHz switching frequency are as follows: MOSFET Q1 and MOSFET Q2 may be embodied by part number IRFR 014 manufactured by International Rectifier of El Segundo, Calif.; Diodes D1 and D2 may be embodied by part no. MBR0540T1 manufactured by ON SEMICONDUCTOR of Phoenix, Ariz.; the completed inductors L1, L2 and L3, L4 may be embodied by part No. S33018 (self-inductance of each half-winding is 300 nH, K=0.92 manufactured by Vanguard Electronics, of Gardena, Calif.

One of ordinary skill in the art will recognize that if a bipolar transistor was used instead of MOSFETs, Q1 and Q2, then an anti-parallel diode is required across each of Q1 and Q2 with its cathode connected to the drain.

This invention has been disclosed in terms of a certain embodiment. It will be apparent that many modifications can be made to the disclosed apparatus without departing from the invention. Therefore, it is the intent of the appended claims to cover all such variations and modifications as come within the true spirit and scope of this invention.

What is claimed is:

1. A regenerative gate drive circuit comprising:
   a positive power source coupled to a first switching device;
   a negative power source coupled to a second switching device;
   a first inductor network comprises a first winding and a second winding on each side of a center tap, said center tap being coupled to a gate input of a power MOSFET;
   a second inductor network comprises a first winding in series with a first blocking capacitor and a second winding in series with a second blocking capacitor on each side of a center tap, said center tap being coupled to said gate input of a power MOSFET and to said center tap of said first inductor network;
   said first switching device, coupled between said positive power source and said first winding of said first inductor network in parallel with said first blocking capacitor in series with said first winding of said second inductor network, for providing a path for a first current to flow through said first switching device and said first winding of said first inductor network in parallel with said first winding of said second inductor which is in series with said first blocking capacitor;

said second switching device, coupled between said negative power source and said second winding of said first inductor network in parallel with said second winding of said second inductor network, said second winding being in series with a second blocking capacitor, for providing a path for resonant discharging of said power MOSFET; a first input signal coupled to a gate of said first switching device for controlling said first switching device;

a second input signal coupled to a gate of said second switching device for controlling said second switching device;

means coupled to said first switching device and said second switching device for limiting the voltage provided at the gate of said power MOSFET and for conducting inductive current; and means coupled between said positive power source and said second switching device and between said negative power source and said first switching device for limiting the voltage at the gate of said power MOSFET and for conducting inductive current.

2. The regenerative gate drive circuit as recited in claim 1 wherein:

each of said first switching device and said second switching device comprises a MOSFET.

3. The regenerative gate drive circuit as recited in claim 2 wherein:

said first input signal is coupled to an input gate of said first MOSFET, and said second input signal is coupled to an input gate of said second MOSFET.

4. The regenerative gate drive circuit as recited in claim 1 wherein:

said first winding and said second winding of said first inductor network and said second inductor network comprises an equal number of turns.

5. The regenerative gate drive circuit as recited in claim 1 wherein:

said limiting means comprises a first diode coupled between said positive power source and said second switching device and a second diode coupled between said negative power source and said first switching device.

6. The regenerative gate drive circuit as recited in claim 1 wherein said second inductor network provides reduced output impedance thereby improving noise immunity.

7. The regenerative gate drive circuit as recited in claim 1 wherein said first inductor network and said second inductor network provide a high impedance between said first switching device and said second switching device when said switching devices are both conducting simultaneously.

8. The regenerative gate drive circuit as recited in claim 1 wherein said circuit comprises a dead time interval when said first input signal and said second input signal are at a level that turns-off said first switching device and said second switching device thereby enabling energy recovery.

9. The regenerative gate drive circuit as recited in claim 8 wherein control of said dead time interval is provided by means for sensing any one of an output voltage or output current of said power MOSFET, or power across said power MOSFET or temperature at a junction of said power MOSFET.

10. A method for providing a regenerative gate drive circuit comprising the steps of:

providing a positive power source coupled to a first switching device;

providing a negative power source coupled to a second switching device;

providing a first inductor network having a first winding and a second winding on each side of a center tap, said center tap being coupled to a gate input of a power MOSFET;

providing a second inductor network having a first winding in series with a first blocking capacitor and a second winding in series with a second blocking capacitor on each side of a center tap, said center tap being coupled to said gate input of a power MOSFET and to said center of tap of said first inductor network;

providing a path for a first current to flow through said first switching device and said first winding of said first inductor network in parallel with said first winding of said second inductor which is in series with said first blocking capacitor, said first switching device being coupled between said positive power source and said first winding of said first inductor network in parallel with said first blocking capacitor in series with said first winding of said second inductor network;

providing a path for resonant discharging of said power MOSFET through said second switching device coupled between said negative power source and said second winding of said first inductor network in parallel with said second winding of said second inductor network, said second winding being in series with a second blocking capacitor;

controlling said first switching device by a first input signal coupled to a gate of said first switching device;

controlling said second switching device by a second input signal coupled to a gate of said second switching device;

limiting the voltage provided at the gate of said power MOSFET and conducting inductive current by means coupled to first switching device and said second switching device; and limiting the voltage provided at the gate of said power MOSFET and conducting inductive current by means coupled between said positive power source and said second switching device and between said negative power source and first switching device.

11. The method as recited in claim 10 comprises the step of providing a MOSFET for each of said first switching device and said second switching device.

12. The method as recited in claim 10 wherein said method comprises the steps of:

coupling said first input signal to an input gate of said first MOSFET; and coupling said second input signal to an input gate of said second MOSFET.

13. The method as recited in claim 10 wherein said method comprises the step of providing said first winding and said second winding of said first inductor network and said second inductor network with an equal number of turns.

14. The method as recited in claim 10 wherein said step of limiting the voltage of the gate of said power MOSFET comprises the steps of:

providing a first diode coupled between said positive power source and said second switching device; and providing a second diode coupled between said negative power source and said first switching device.

* * * * *